United States Patent [19]

Wilson et al.

[11] 4,150,393

[45] Apr. 17, 1979

[54] HIGH FREQUENCY SEMICONDUCTOR PACKAGE

[75] Inventors: Richard W. Wilson; Marcy B. Goldstein, both of Phoenix, Ariz.

[73] Assignee: Motorola, Inc., Schaumberg, Ill.

[21] Appl. No.: 766,168

[22] Filed: Dec. 20, 1979

Related U.S. Application Data

[63] Continuation of Ser. No. 617,918, Sep. 29, 1975, abandoned.

[51] Int. Cl.² .................. H01L 23/02; H01L 23/12; H01L 39/02
[52] U.S. Cl. ....................... 357/74; 357/80; 357/81; 174/52 S; 333/246
[58] Field of Search ............... 357/74, 80, 81; 174/52 S; 333/84 M

[56] References Cited

U.S. PATENT DOCUMENTS

| | | | |
|---|---|---|---|
| 3,325,704 | 6/1967 | Belasco et al. | 357/81 |
| 3,626,259 | 12/1971 | Garboushian | 357/81 |
| 3,705,255 | 12/1972 | Low et al. | 174/52 S |
| 3,808,474 | 4/1974 | Cooke et al. | 357/74 |
| 3,946,428 | 3/1976 | Anazawa et al. | 357/81 |

*Primary Examiner*—Andrew J. James
*Attorney, Agent, or Firm*—Michael D. Bingham

[57] ABSTRACT

A low parasitic microwave transistor package is provided including a metal header formed from a base member and having a cylindrical center portion; a metallized ceramic insulator formed in an annular ring which is attached to the metal header and surrounding the center portion thereof. A shallow channel is provided in the surface of the pedestal or center portion of the metal header in which a metallized beryllia insulator is attached. Metal leads are attached to the ceramic insulator. The metallized beryllia insulator is suitable for a semiconductor die chip to be attached to the outward surface thereof such that any one of the preferred electrodes of the semiconductor chip can be attached to the header, by stitch bonding, through a very low inductance, low resistance connection. The other electrodes of a semiconductor chip may be selectively attached, via stitch bonds, directly to the metal leads or connected in series thereto through MOS capacitor chips which can be attached to the remaining surface area of the pedestal.

10 Claims, 4 Drawing Figures

HIGH FREQUENCY SEMICONDUCTOR PACKAGE

This is a continuation of application Ser. No. 617,918, filed Sept. 29, 1975 and now abandoned.

BACKGROUND OF THE INVENTION

This invention relates to microwave transistor packages having very low parasitic inductance and capacitance associated with the leads thereof.

High frequency semiconductor packages are used for holding high frequency semiconductor components, such as microwave transistors and the like, and providing readily available terminals for connection to other components. For such packages it is important to reduce parasitic coupling between terminals, which parasitic coupling degrades the performance of the transistor. At microwave frequencies, the parasitic inductances and capacitances associated with the leads of the semiconductor packages limit the gain and bandwidth of the transistors housed therein. The critical inductive parasitic components in a microwave transistor package are the inductance of the input terminal and the inductance of the terminal connected to the ground. The inductance of the terminal connected to the ground may be particularly critical, because it is inaccessible, and can not be turned out with additional external components.

A variety of high frequency semiconductor packages utilized in the past have suffered from a variety of shortcomings usually in bonding to lead terminals at different heights, and involving a plurality of electrically conducting members and electrically insulative members bonded together, requiring expensive precision components in construction of the package.

A couple of high frequency semiconductor packages having a structure which provides excellent high frequency performance and yet require a small number of parts in the construction thereof are described in U.S. Pat. No. 3,784,884 and pending U.S. patent application, Ser. No 383,872, both assigned to the assignee of the present invention. The structure described in the above patent requires coined bonding rails extending from the header in one embodiment thereof which requires an expensive coining apparatus and also requires the use of expensive material such as silver for the header. Furthermore, design modifications for this prior art high frequency semiconductor package to accommodate larger semiconductor chips usually require extensive redesign of most of the package parts and fabrication apparatus, thereby making design modifications extensive. The pending disclosure is an improvement over the former in that the two bonding rails used for the low inductance, low reactance bonding are made of cylindrical wires.

However, both of the aforementioned prior art disclosures describing semiconductor packages use a square or rectangular format of construction. Structurally, both of these designs exhibit several deficiencies. The rectangular format induces mechanical stress concentrations at the interior corners of the ceramic member. This may result in fracturing the corners during package assembly. To overcome this, it is necessary to include a molybdenum window frame member in the construction to serve as an expansion buffer between the ceramic and copper base. Furthermore, because of the delicate nature of the wire rails and the difficulty of retaining them in position along with a metallized die bond insulator during brazing of the components together, there has been a higher yield loss due to poor positioning of these components than is desirable.

Thus, a need exists to solve many of the aforementioned shortcomings of the prior art by providing a less complex and lower cost semiconductor package.

SUMMARY OF THE INVENTION

Accordingly, it is an object of the present invention to provide an improved high frequency semiconductor package.

In accordance with one embodiment of the present invention there is provided a semiconductor package comprising a metal header having a base member and including a cylindrical or pedestal portion extending from the base member. A shallow channel is formed in the surface of the pedestal member. A cylindrical annular ring insulating member is disposed about the pedestal and is attached to the base member, which insulating member has metallized surfaces to which a pair of metallized lead members are attached. A metallized thermal conductive insulator is attached to the metal header within the channel to which a semiconductor chip may be attached thereto. A suitable hermetic seal may be provided for the semiconductor package.

DESCRIPTION OF THE INVENTION

Figure 1:
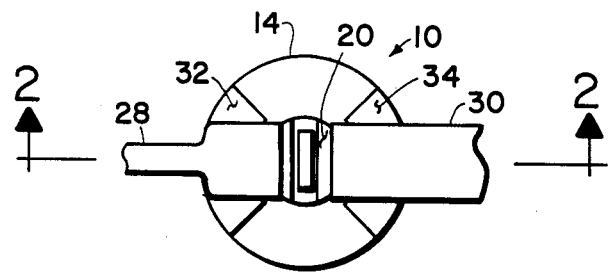
FIG. 1 is a plan view of one embodiment of the invention.
Figure 2:
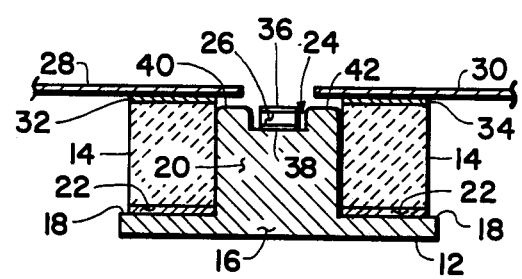
FIG. 2 is a cross-sectional view taken substantially in the direction of the arrows 2—2 of FIG. 1.

Referring to FIGS. 1 and 2, there is shown semiconductor package 10 of the present invention which is suitable for housing a high frequency semiconductor chip (not shown). Semiconductor package 10 includes metal header 12, which may be copper but can be readily cold formed. A first insulator 14, which may be ceramic, preferably alumina $Al_2O_3$), is attached to base member 16 of metal header 12 on the upper surfaces 18 thereof. Alumina insulator 14 is formed in an annular ring structure having a central opening and is disposed about pedestal member 20. Insulator 14 is attached to surfaces 18 by means of metallization layer 22 which is deposited on the bottom surface of the insulator. Pedestal member 20 is shown as including shallow channel 24 in which thermally conductive ceramic insulator 26 is brazed therein. Insulator 26, may be ceramic, preferably beryllia (BeO). First and second leads 28 and 30 are attached to insulator 14, preferably diametrically opposed to one another, by means of metallization layers 32 and 34.

Referring particularly to FIG. 2, it is seen that leads 28 and 30 extend over a portion of the surfaces of pedestal number 20. However, in FIGS. 3 and 4, wherein the same reference numerals are used for like components of FIGS. 1 and 2, metallic leads 28 and 30 are shown as being positioned further outward of channel 24 and upper surface of pedestal 20. The reasons for the above noted differences in the semiconductor package of FIG. 3 over that of FIG. 1 will be discussed hereinafter.

The upper surface of beryllia insulator 26 is metallized with metallization layer 36, and the bottom surface is metallized with metallization layer 38, which provides means for attaching of insulator 26 to channel 24 of metal header 12.

A high frequency semiconductor device, such as microwave transistor, may then be die bonded to metallization layer 36, and, for example, the transistor's base terminal bonding pads may be symmetrically bonded to surfaces 40 and 42 of pedestal 20 to provide extremely low inductance, and low resistance connection in series with the base lead. The emitter and collector bonding pads may be stitch bonded to leads 28 and 30 respectively to provide an extremely high frequency device with superior operating characteristics suitable for use in numerous applications.

Several significant advantages are obtained by the structure of semiconductor package 10 over the prior art. The concept of the channel package solves both the structural and yield problems of the previous designs while not seriously degrading the superior electrical characteristics of the semiconductor packages as disclosed in U.S. Pat. No. 3,784,884, for example. Cylindrical insulator 14 eliminates the sharp corners of the rectangular prior art packages and thus the cracking which is associated with these rectangular piece parts. By providing a shallow channel in the pedestal member of header 12, the surface of the recessed beryllia substrate 26 can be fixed at the same level as the base surfaces 40 and 42 of the pedestal which eliminates the need for the wire bonding rails as disclosed in the prior art patent. Furthermore, because of the width to height ratio of the bonding pedestal, the metal header can be readily cold-formed. The ability to cold-form the metal header along with elimination of the rails and also the elimination of the structural cracks in the ceramic member provides a more reliable and considerable lower cost semiconductor package. Semiconductor package 10, as shown, is especially suitable for use in stripline applications. However, it will be apparent to one skilled in the art that base member 16 of metal header 12 may, for example, include a threaded stud for conveniently mounting semiconductor package 10 onto a chassis.

Figure 3:
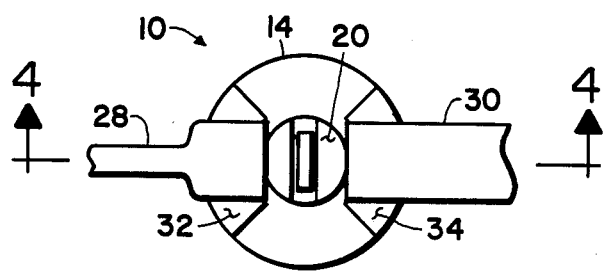
FIG. 3 is a plan view of another embodiment of the invention.
Figure 4:
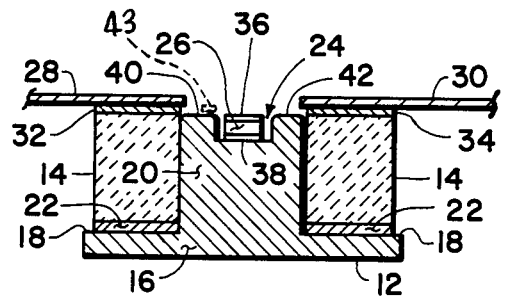
FIG. 4 is another cross-sectional view taken substantially in the direction of the arrows 4—4 of FIG. 3.

Referring to FIGS. 3 and 4, as briefly mentioned above, metal leads 28 and 30 are formed at an extended distance apart from those of FIG. 1 and 2. In this embodiment, surfaces 40 and 42 of pedestal 20 can be utilized to have a MOS chip capacitor 43 attached respectively thereto to provide a controlled Q for the transistor package. Controlled Q means that such devices are easier to match into circuit networks and offer better consistency of high frequency parameters than non-controlled Q high frequency devices. It is understood that modifications of FIGS. 1-4 can be made in which there is no controlled Q (CQ) or only input CQ, or output CQ for the transistor device made utilizing the semiconductor package illustrated by the drawings. Semiconductor package 10 provides for minimum wire length to the emitter and collector leads to be maintained. This novel feature permits the use of one metal header subassembly and one annular ring ceramic member for a family of the package configurations discussed above.

The method of manufacturing a semiconductor package according to the present invention is now described referring to FIGS. 1 through 4. Metal header 12, which is preferably copper, as previously described, is readily cold-formed with channel 24. Insulator 14, which advantageously is alumina having its top and bottom surface metallized (metallization layers 18, 32 and 34) is disposed about pedestal 20. Metallization regions 18, 32 and 34 may be any suitable type of metallization, as is known in the art which may be suitably fused with copper metal header 12. Thermally conductive insulator 26, which may be beryllia having metallized surfaces 36 and 38 is positioned into channel 24. Metallization layers 36 and 38 may be any suitable type which may be successfully fused with the copper header and to which a semiconductor die chip may be successfully die bonded to complete the package. Metallization layers 36 and 38 advantageously are titanium-tungsten-gold (or, alternately, titanium-molybdenum-gold) the titanium forming a layer adherent to the beryllia, the tungsten (or molybdenum) acting as a barrier to prevent migration of the titanium, and the gold forming a layer to which further gold plating or dye bonding can be achieved. The alumina substrate 14 and thermally conductive beryllia substrate 26 along with metal leads 28 and 30 are brazed together in one operation to form a single unit. A suitable semiconductor transistor chip may be die bonded onto insulator 26 in the usual manner along with the MOS chip capacitors if desired. Subsequently, wire bonding is accomplished to conect, for example, the emitter and collector electrodes of the transistor chip to metal leads 28 and 30.

It should be understoodthat a hermatic package can be obtained using the aforedescribed structure in the usual manner. For example, metal leads 28 and 30 can be first made as a piece part with the leads sealed in ceramic, which is then brazed to the upper surface 32 and 34 of insulator 14 during the aforementioned brazing or fusing operation. Moreover, lead members 28 and 30 may be attached to a lead frame member (not shown), or they may be separate members. After the transistor chip has been assembled into semiconductor package 10 the cap (not shown) is then attached over semiconductor package 10 in a manner well known in the art.

Those skilled in the art will recognize that additional leads can be attached to alumina insulator 14, utilizing process steps entirely similar to those described, to provide connection to semiconductor chip having more than three electrodes, for example a high frequency field effect transistor tetrode.

In summary, the invention provides a simplified method of producing a high performance, high frequency semiconductor package at much lower cost than previously achievable by the prior art. Improved performance is achieved by virtue of the simplified structure over that of the prior art, and a reduced cost is achieved by provision of a workable, producible fabrication method which permits the use of low cost materials and elimination of the use of bonding rails which have been used to reduce the package inductance and resistance. The elimination of the bonding rails eliminates the problems associated therewith which includes retaining them in position along with the metallized beryllium insulator during brazing of the components together which further reduces the cost of the semiconductor package of the present invention. Further, the fabrication of the semiconductor package of the present invention in cylindrical form eliminates problems of the prior art caused by the inducted mechanical stress concentrations of the rectangular format. Therefore, it is seen that the invention provides a lower cost high frequency semiconductor package compared to those previously obtained.

Although the invention has been described with reference to several embodiments thereof, it will be clear to those skilled in the art that variations in arrangements of partsand manufacturing steps may be made within the scope of the invention to suit varying requirements.

What is claimed is:

1. A stripline semiconductor package comprising:
an integrally formed metal header including a base member and a cylindrical pedestal member, said pedestal member having a channel formed in the surface thereof defining a first surface portion and second surface portion of said pedestal member;
a cylindrical insulating member in the form of an annular ring disposed about said pedestal member of said metal header and attached to said base member of said metal header;
a thermally conductive insulator attached to said metal header within said channel; and
first and second flat coplanar metal ribbon lead members each attached to said cylindrical insulating member in substantially parallel relationship to said surface of said pedestal member, said first and second lead members extending over said first and second surface portions, respectively, by a respective predetermined amounts to permit attachment of impedance transforming elements to said first and second surface portions as desired.

2. The semiconductor package of claim 1 wherein the outward surface of said thermally conductive insulator is substantially fixed at the same level of the surface of said pedestal member.

3. The semiconductor package of claim 1 wherein said first and second metal lead members extend over the major portion of respective ones of said first and second surface portions of said pedestal member of said metal header.

4. The semiconductor package of claim 1 wherein said first and second metal lead members extend over a minor portion of respective ones of said first and second surface portions of said pedestal member of said metal header.

5. The semiconductor package of claim 1 wherein said first and second metal lead members are interchangeably attached to said cylindrical insulating member whereby either one of said first and second lead members, respectively, extends over a major and minor portion of the surface area of said pedestal member of said metal header.

6. A stripline semiconductor package comprising:
a metal header having a base member and a cylindrical pedestal member extending outwardly from a central portion of said base member and being formed integrally therewith, said pedestal member having a channel formed in the outward surface thereof, said channel further defining a first and second surface portion of said pedestal surface;
a cylindrical insulating member in the form of an annular ring disposed about said cylindrical pedestal member, said insulating member having first and second metallized planar surfaces with said first metallized surface being attached to said base member of said metal header;
a thermally conductive insulator having a first and second metallized surfaces, said conductive insulator being attached at said first surface to said metal header within said channel; and
first and second coplanar metal ribbon lead members attached to said second metallized surface of said cylindrical insulating member, said first and second metal lead members being diametrically opposed with respect to each other and extending over said first and second surface portions, respectively, by a predetermined amount to permit capacitive elements to be attached to said first and second surface portions as desired.

7. The semiconductor package of claim 6 wherein said second surface of said thermally conductive insulator is substantially fixed at the same level as the outward surface of said pedestal member of said metal header.

8. The semiconductor package of claim 6 wherein said first and second metal lead members extend, respectively, over a major portion of said first and second surface portions of said pedestal member of said metal header.

9. The semiconductor package of claim 6 wherein said first and second metal lead members extend, respectively, over a minor portion of said first and second surface portions of said pedestal member of said metal header.

10. The semiconductor package of claim 6 wherein said first and second metal lead members are suitably attached to said cylindrical insulating member whereby either one or both of said first and second lead members respectively extends over a major and minor portion of respective first and second surface portions of said pedestal member of said metal header.

* * * * *

UNITED STATES PATENT AND TRADEMARK OFFICE
CERTIFICATE OF CORRECTION

PATENT NO. : 4,150,393

DATED : April 17, 1979

INVENTOR(S) : Richard W. Wilson et al.

It is certified that error appears in the above-identified patent and that said Letters Patent are hereby corrected as shown below:

On the title page, Item [22] should read -- February 2, 1977 --.

Signed and Sealed this

Thirty-first Day of July 1979

[SEAL]

Attest:

LUTRELLE F. PARKER

Attesting Officer

Acting Commissioner of Patents and Trademarks